United States Patent [19]
Simons

[11] Patent Number: 5,437,328
[45] Date of Patent: Aug. 1, 1995

[54] MULTI-STAGE HEAT SINK

[75] Inventor: Robert E. Simons, Poughkeepsie, N.Y.

[73] Assignee: International Business Machines Corporation, Armonk, N.Y.

[21] Appl. No.: 230,678

[22] Filed: Apr. 21, 1994

[51] Int. Cl.[6] .............................................. F28F 13/00
[52] U.S. Cl. .................................... 165/146; 165/185; 361/692
[58] Field of Search ....................... 165/80.3, 146, 185; 174/16.3; 257/721, 722; 361/690, 692, 703

[56] References Cited

U.S. PATENT DOCUMENTS

| | | | |
|---|---|---|---|
| 2,512,540 | 6/1950 | Friedman | 165/146 |
| 4,103,737 | 8/1978 | Perkins | 165/146 X |
| 4,587,595 | 5/1986 | Staples | 165/80.3 X |
| 4,765,397 | 8/1988 | Chrysler et al. | 165/104.33 |
| 4,918,571 | 4/1990 | Grabbe | 174/16.3 X |
| 5,002,123 | 3/1991 | Nelson et al. | 165/147 |
| 5,072,787 | 12/1991 | Nakamichi | 165/80.3 |

Primary Examiner—Allen J. Flanigan
Attorney, Agent, or Firm—Lawrence D. Cutter

[57] ABSTRACT

A multi-stage heat sink for cooling an integrated circuit module is described. The heat sink is preferably formed by an assembly of plates. A unique arrangement of slots in each plate forms different stages of air flow channels. Each stage contains a different number of slots with the number of slots increasing in successive stages. Thermal conduction of heat away from the module through fins which define the air flow channels is balanced against convective heat transfer from air flow channel walls at each stage to improve total heat transport per heat sink volume and to achieve a very low thermal resistance heat sink.

16 Claims, 4 Drawing Sheets

MULTI-STAGE HEAT SINK

BACKGROUND OF THE INVENTION

This invention relates to devices for improving heat transfer, and more particularly to an improved heat transfer device for removing heat generated from air cooled integrated circuit modules or other electromechanical and electronic components.

Integrated circuit modules generate heat equal to the power used to operate them and the heat flux involved is inversely proportional to their size. Thus increasingly smaller modules result in higher heat flux values. Unless the heat is effectively dissipated, the modules often will not operate as intended. Due to design improvements, integrated circuit modules use more power and have become smaller and therefore require improved heat transfer mechanisms to handle the increased heat generated over a smaller area.

Traditional air cooled heat sinks are employed in close contact with the elements they cool. The heat sinks are typically made of a conductive material such as metal, for example aluminum or copper, and have a base from which cooling structures such as pins or fins extend to conduct heat away from the module. These sinks generally utilize a virtually uniform fin thickness and size. If the cooling fins are thin, the sink has good convective heat transfer (to the surrounding air) but poor conductive transfer (to the surrounding structure). This is because thin fins allow more fins to be placed within a given width and therefore provide greater area for heat transfer to the air. If the cooling fins are thick, however, the converse is true: good conductive transfer but poor convective transfer because of reduced total heat transfer area.

As the structures extend further away from the element to be cooled, some heat is transferred to the surrounding air via convection and less heat is transferred via conduction along the fins. Since less heat needs to be conducted in these distal regions, the fins can be reconfigured to provide greater area for increased convective heat transfer. Single stage heat sinks fail to take advantage of this principle. Thus what is needed therefore is a multi-stage heat sink in which each stage balances conductive versus convective heat transfer in order to optimize total heat transport per heat sink volume.

SUMMARY OF THE INVENTION

The multi-stage heat sink of the present invention provides a means to air cool higher powered integrated circuit modules or to provide lower module operating temperatures within a given heat sink volume than conventional single stage heat sinks. The present heat sink is preferably composed of stacked metal plates with slots positioned such that the layered structure provides multiple stages of parallel air flow channels, with the number of channels increasing at each successive stage. It is noted however that other methods of manufacture are possible and this invention is not restricted to a stacked plate construction. The fin thickness between air flow channels and the number of air flow channels is balanced at each stage to achieve an improved balance of heat transfer via conduction and heat transfer via convection in order to increase total heat transport per heat sink volume.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DESCRIPTION OF THE PREFERRED EMBODIMENT

Figure 1:
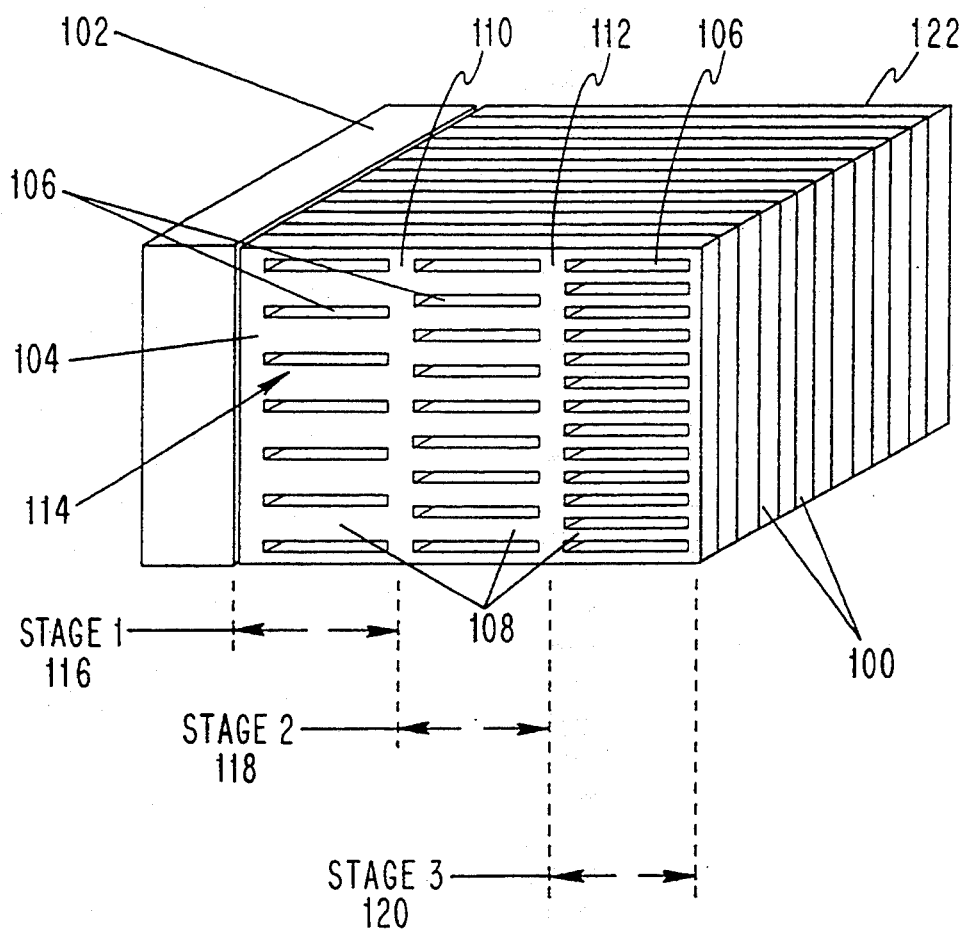
FIG. 1 is an isometric view of a multi-stage heat sink in accordance with the present invention.

Referring to FIG. 1, multi-stage heat sink 122 is formed from an assembly of stacked plates 100. The concept of a heat sink composed of stacked plates having a pattern of holes, or slots, which when the plates are laminated together form a compact structure having internal air flow passages was discussed in IBM Technical Disclosure Bulletin Volume 35, No. 4A, September 1992, pp. 378–379 titled "Laminated Heat Sink" by M. J. Ellsworth and D. T. Vader and is incorporated by reference herein in its entirety.

Returning to FIG. 1, slots in plates 100 are aligned such that when plates 100 are stacked together, air flow channels 106 through heat sink 122 are formed. A three stage heat sink is depicted in FIG. 1, although a different number of stages is possible depending on the heat transfer coefficient, the thermal conductivity of the heat sink material, channel thickness, and total available width, depth, and height.

There are two principal methods for transferring heat in this invention: conduction and convection. Heat is transferred away from module 102 and through heat sink 122 via conduction through fins 108. Heat in heat sink 122 is transferred at the same time from the sink to the surrounding air (or other surrounding fluid) as air 114 (which is cooler than the heat sink) flows around the heat sink and through channels 106. Thicker fins provide greater heat transfer via conduction. Thicker fins also mean that there are fewer channels to provide heat transfer via convection. The first stage (closest to base 104 of heat sink 122 which is disposed so as to be in thermal contact with integrated circuit module 102) has the fewest number of channels 106, and the thickest fins 108. Therefore, in the first stage, the greatest heat transfer away from module 102 is via conduction. Some heat is transferred to air 114 passing through and around heat sink 122 via convection in first stage 116, so less heat enters second stage 118 from top plate 110 of first stage 108. Less heat entering second stage 118 allows thinner fins to achieve a more desired degree of conductive heat transfer to third stage 120 from top plate 112 of second stage 108. Thinner fins also provide more space for channels, and thus more channels may be provided to increase convective heat transfer from the exposed channel walls in second stage 118. Thus each successive stage passes less heat onto the next stage. However, each stage is designed to improve the balance between conductive and convective heat transfer therein.

Although the height of each stage is the same in the embodiment shown in FIG. 1, this is not a requirement, and in fact the optimal design includes stages of different lengths. The channels are preferably parallel to each other within each stage and all are also preferably normal to the base of the heat sink. The channels generally have a uniform thickness to provide uniform flow pressure drop characteristics across the heat sink.

Figure 2:
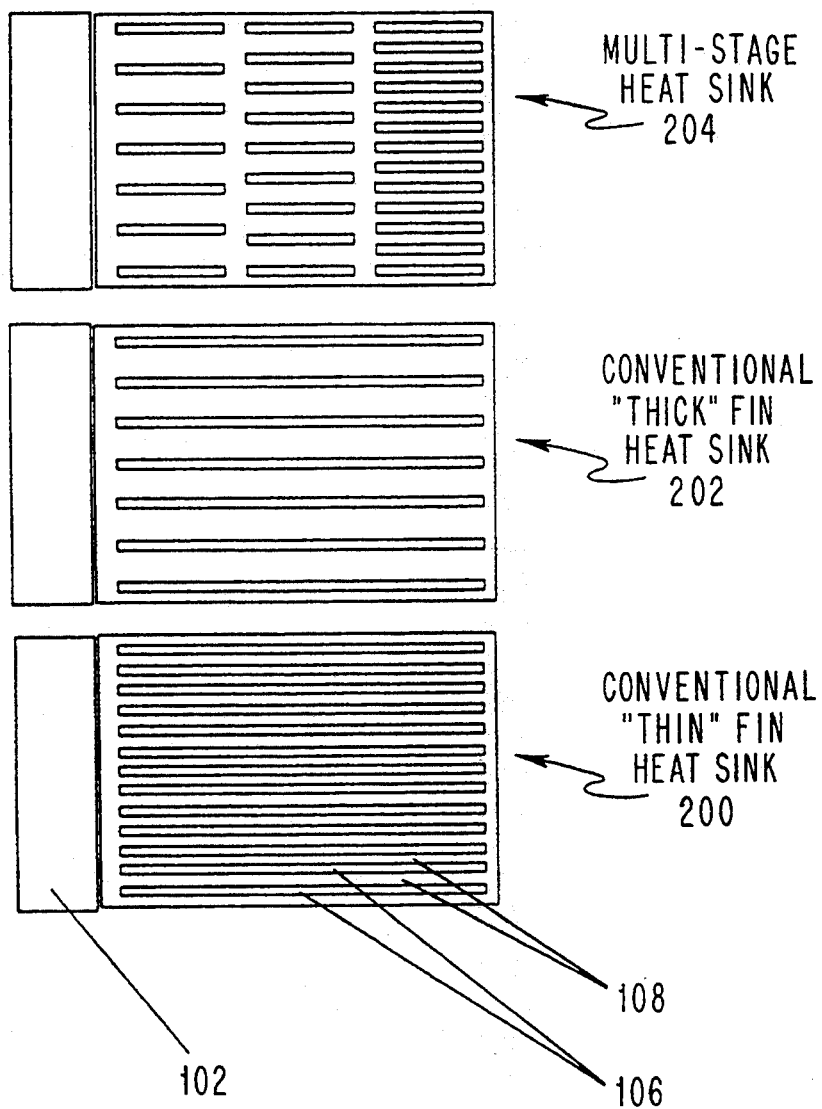
FIG. 2 is a frontal view comparing cross sections of a multi-stage heat sink with two types of conventional heat sinks.

FIG. 2 illustrates differences between conventional heat sinks and the multi-stage heat sink of the present invention. The conventional heat sink with "thick" fins offers better thermal conduction but poorer thermal convection. In contrast, the conventional heat sink with "thin" fins offers better thermal convection but poorer thermal conduction. The multistage heat sink concept, however, provides the opportunity to trade off thermal conduction versus thermal convection heat transport at each stage to maximize the total heat transport per heat sink volume and thus to achieve the lowest thermal resistance heat sink.

Figure 3A:
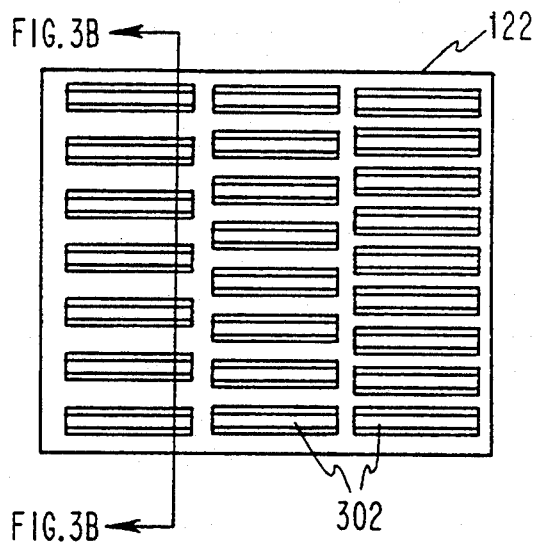
FIG. 3a shows a front view of a multi-stage heat sink with tapered air flow channels.
Figure 3B:
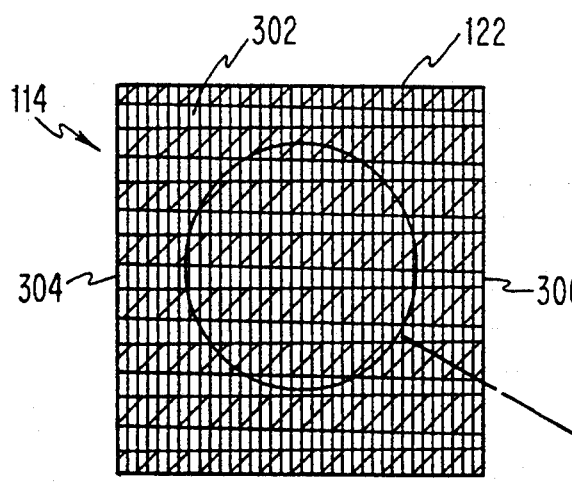
FIG. 3b shows a cross section of tapered air flow channels.
Figure 4:
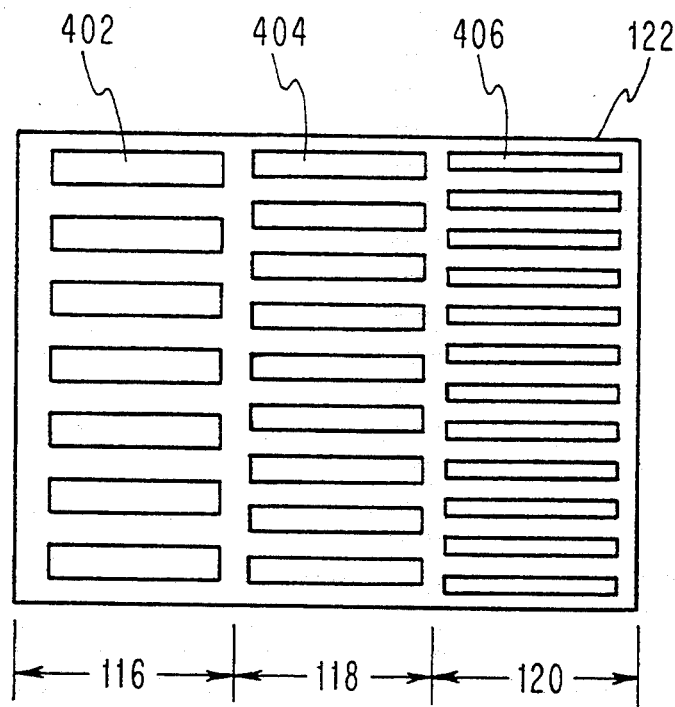
FIG. 4 shows a multi-stage heat sink with narrower air flow channels at each successive stage.

A multi-stage heat sink with air flow channels of uniform thickness provides the lowest pressure drop, but non-uniform channels may be used to advantage if further increases in the rate of heat removal are required. FIGS. 3a, 3b, and 4 illustrate two configurations of non-uniform channels.

Figure 3C:
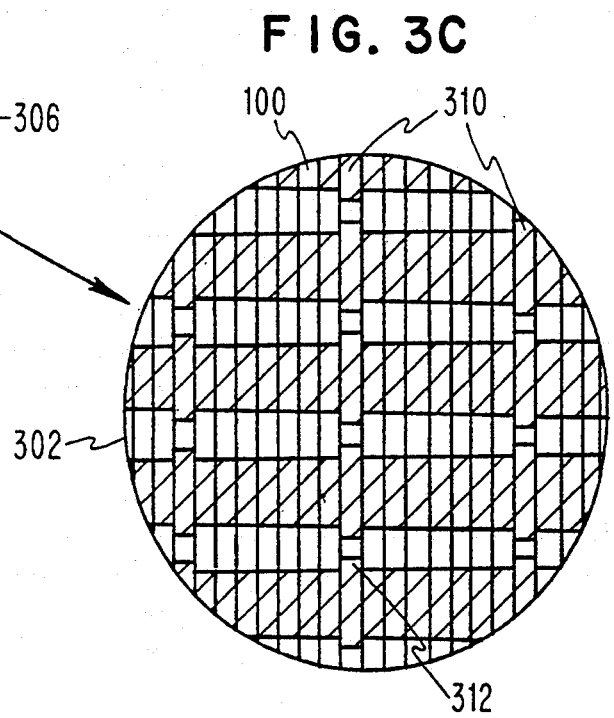
FIG. 3c shows a cross sectional view illustrating the presence of protuberances in the air flow channels.

As cooling air moves along a heated channel, heat is transferred from the adjacent wall(s) to the air, resulting in an increase in air temperature along the channel. It is well known that the rate of heat transfer per unit area is proportional to the product of the heat transfer coefficient and the difference in temperature between the channel wall and the cooling air. Increased air temperature along the channel results in a reduction in the rate of heat transfer per unit area along the channel. It is also known that the magnitude of the heat transfer coefficient is inversely proportional to channel thickness. Accordingly, by using tapered channels 302 in heat sink 122 as shown in FIGS. 3a and 3b, the heat transfer coefficient may be caused to increase along the channel; thereby compensating for the effect of increasing air temperature. A tapered flow channel with a wide entrance 304 and a narrow exit 306 (air flow 114 is as shown) may be obtained by using progressively narrower slots in a construction of stacked plates 100. Heat transfer in the channels may be further enhanced by promoting turbulence in the air flow, which increases the heat transfer coefficient. Turbulence may be induced by placing strips or ribs on a wall transverse to the flow direction. FIG. 3c indicates how the equivalent of turbulator strips may be fashioned in a stacked structure by periodically introducing plates with narrower slots 310 creating discontinuities or protuberances 312 in the wall surface of channels 302. Although protuberances are shown in tapered channels it should be appreciated that similar protuberances may be introduced in multi-stage heat sink structures with uniform channels.

The highest wall temperatures occur in the stage(s) near the base of the heat sink, and the lowest wall temperatures occur in stage(s) farther away from the base. Accordingly, it is advantageous to provide higher air flow over the regions of higher temperature to achieve higher heat transfer rates. Therefore channels of different thickness at each stage can be used to provide higher air flow rates through the stage(s) nearest to the base. As shown in FIG. 4, the widest channels 402 are provided in first stage 116 of heat sink 122 and successively narrower channels 404, 406 are provided in second and third stages 118 and 120 respectively. Narrower channels result in a higher pressure drop at a given air flow rate. Air flowing through the channels will apportion itself to produce a nearly uniform pressure drop across all the channels. Accordingly a greater amount of air will flow through wider channels in the lower stage(s) and a lesser amount of air will flow through narrower channels in the successive stages.

As noted above, a multi-stage heat sink may be manufactured by methods other than the stacking of metal plates. For example, extrusion may be used to form metal heat sinks, but with existing technology, the number of fins would generally be thicker and thus fewer in number and the resulting channels would be larger. A multi-stage heat sink may also be made of other materials such as graphite, or a metal-graphite composition to lessen the total weight of the heat sink. Not only is it possible to employ metal and graphite compositions, it is also possible to employ alternating layers of metal and graphite plates or plates having other material properties. Hybrid heat sinks are discussed in an article in the Tenth Annual IEEE Semiconductor Thermal Measurement and Management Symposium, Feb. 1-3, 1994, IEEE Catalog Number 94CH3413-2, pp. 17-22, entitled "Thermal Performance of Air-Cooled Hybrid Heat Sinks for a Low Velocity Environment" by M. R. Vogel and is incorporated by reference herein in its entirety.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A heat sink for a body to be cooled comprising:
   a primary stage containing:
   a base adjacent to a body to be cooled;
   a plurality of fins integral with said base and extending to normal to said base and substantially parallel to each other such that internal air flow channels are formed within said primary stage;
   a top plate integral with said plurality of fins and parallel to said base;
   at least one secondary stage containing:
   a plurality of fins integral with said top plate from a previous stage adjacent to said secondary stage in a direction towards said base, said fins extending normal to said top plate and substantially parallel to each other such that internal air flow channels are formed within said secondary stage;
   a top plate integral with said plurality of fins and parallel to said base;
   said internal air flow channels being substantially parallel to each other within said stages and normal to said base;
   said internal air flow channels within each successive stage away from said base increasing in number.

2. The heat sink according to claim 1 wherein said heat sink is composed of metal.

3. The heat sink according to claim 1 wherein said heat sink is composed of graphite.

4. The heat sink according to claim 1 wherein said internal air flow channels are of uniform thickness.

5. The heat sink according to claim 1 wherein said internal air flow channels are of uniform thickness within each stage, and said internal air flow channels are of progressively decreasing thickness with each successive stage away from said base.

6. The heat sink according to claim 1 wherein the length of each of said stages is different.

7. The heat sink according to claim 1 wherein said internal air flow channels are tapered in thickness.

8. A heat sink for a body to be cooled, said heat sink comprising:
- a primary stage including:
  - a base adjacent to a body to be cooled;
  - a first plurality of fins attached to said base and extending normal to said base and substantially parallel to each other so as to provide a first set of internal air flow channels;
  - a first top plate which is attached to said first plurality of fins and which is parallel to said base;
- at least one secondary stage including:
  - a second plurality of fins attached to said first top plate and extending normal to said first top plate and substantially parallel to each other so as to provide a second set of internal air flow channels;
  - a second top plate which is attached to said second plurality of fins and parallel to said base;
- said internal air flow channels, within each successive stage away from said base, increasing in number.

9. The heat sink according to claim 8 wherein said heat sink is composed of metal.

10. The heat sink according to claim 8 wherein said heat sink is composed of graphite.

11. The heat sink according to claim 8 wherein said heat sink is composed of a combination of graphite and metal.

12. A heat sink for a body to be cooled, said heat sink comprising:
- a series of plates stacked in layers with said plates having slots formed therein such that said slots are aligned to form a base, for thermal contact with said body to be cooled, and at least two stages of internal air flow channels;
- said internal air flow channels being substantially parallel to each other within said stages; and with said internal air flow channels increasing in number within each successive stage away from said base.

13. The heat sink according to claim 12 wherein said plates are metal.

14. The heat sink according to claim 12 wherein said plates are graphite.

15. The heat sink according to claim 12 wherein said fins have protuberances projecting into said internal air flow channels.

16. A heat sink for cooling a body, said heat sink comprising:
- a body composed of thermally conductive material having a base for placement in thermal contact with said body to be cooled, said body also having a first row of substantially parallel fluid flow channels adjacent to said base and at least one subsequent row of substantially parallel fluid flow channels disposed adjacent to said first row of channels, with there being more channels in at least one subsequent row of channels than in said first row of channels, said at least one subsequent row of channels being located further away from said base than said first row of channels.

* * * * *